United States Patent [19]

McIntyre

[11] Patent Number: 5,288,236
[45] Date of Patent: Feb. 22, 1994

[54] METHOD AND APPARATUS FOR REPLACING ELECTRONIC COMPONENTS ON A PRINTED CIRCUIT BOARD

[75] Inventor: James B. McIntyre, Cupertino, Calif.

[73] Assignee: Sun Microsystems, Inc., Mountain View, Calif.

[21] Appl. No.: 861,663

[22] Filed: Apr. 1, 1992

[51] Int. Cl.$^5$ ............................................. H01R 9/09
[52] U.S. Cl. .................................... 439/70; 439/72; 439/330; 439/525; 439/746
[58] Field of Search ............... 439/70, 72, 76, 330, 439/525, 628, 741, 743, 744, 746, 834

[56] References Cited

U.S. PATENT DOCUMENTS

| | | | |
|---|---|---|---|
| 3,701,077 | 10/1972 | Kelly, Jr. | 439/330 |
| 4,679,871 | 7/1987 | Egawa | 439/70 |
| 4,696,525 | 9/1987 | Coller et al. | 439/70 |
| 4,925,393 | 5/1990 | Ingalsbe . | |
| 5,007,844 | 4/1991 | Mason et al. | 439/70 |
| 5,013,262 | 5/1991 | Shibano . | |
| 5,020,998 | 6/1991 | Ikeya et al. . | |
| 5,021,000 | 6/1991 | Scheibner . | |

*Primary Examiner*—Paula A. Bradley
*Attorney, Agent, or Firm*—Blakely Sokoloff Taylor & Zafman

[57] ABSTRACT

An apparatus and method for facilitating the installation and removal of standard surface mount clock oscillator modules. A clock oscillator module socket is disclosed which can be mounted on a printed circuit board in the standard recommended land pattern for surface mount clock modules which will provide for easy installation of the clock module and easy removal of the module either for maintenance or for general replacement by a clock of different speed.

9 Claims, 2 Drawing Sheets

RECOMMENDED LAND PATTERN

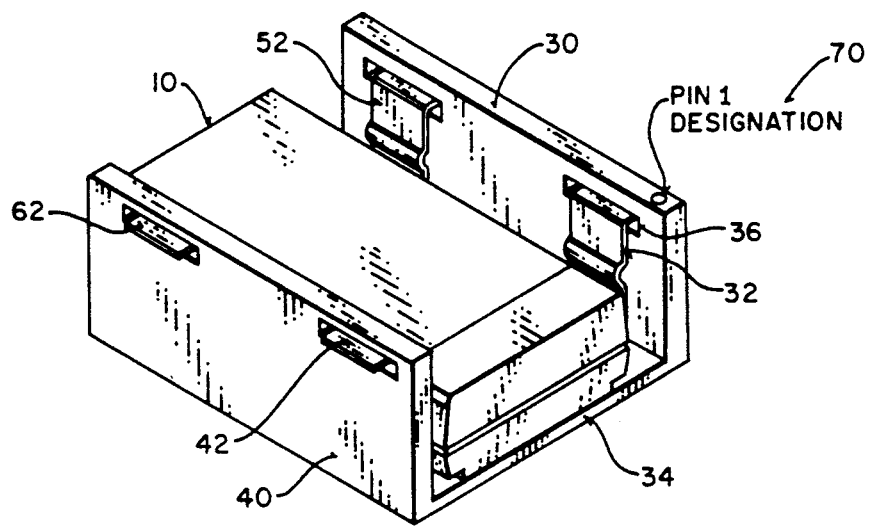
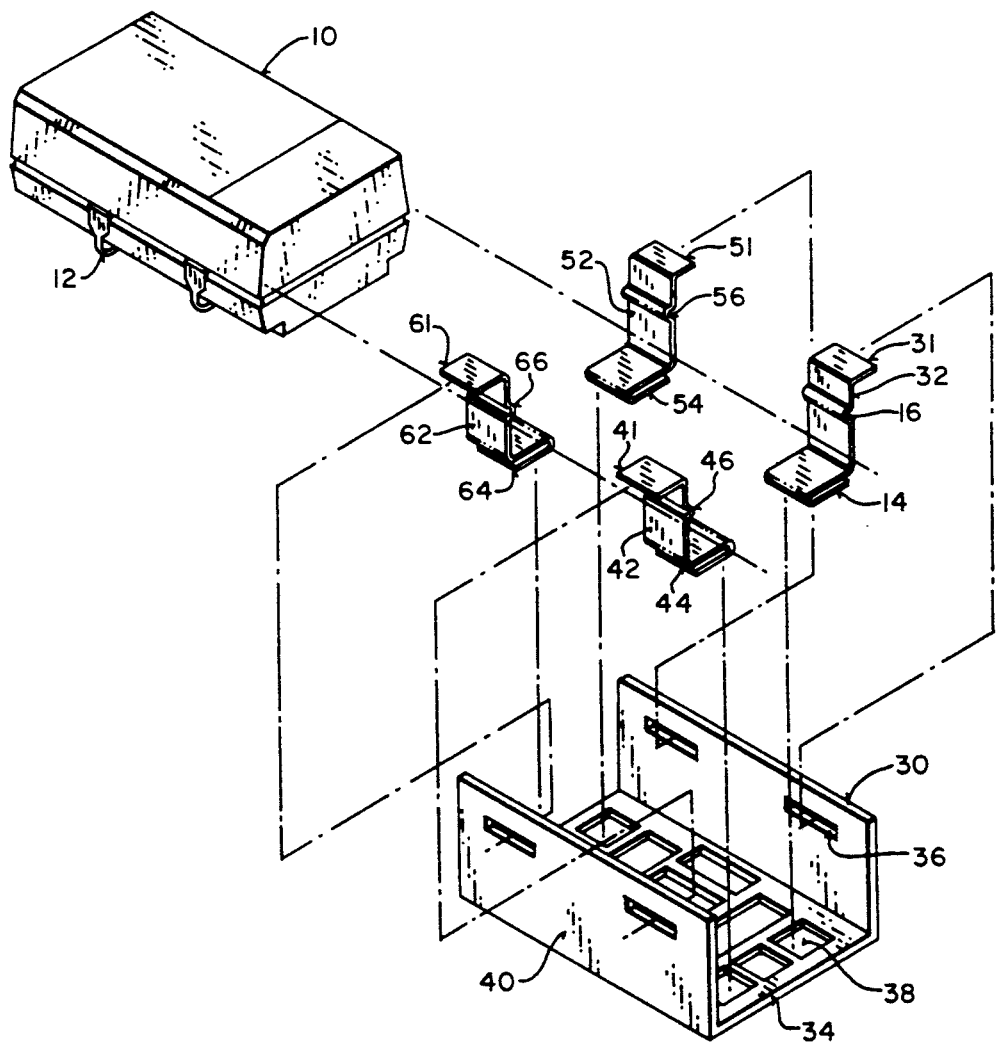

METHOD AND APPARATUS FOR REPLACING ELECTRONIC COMPONENTS ON A PRINTED CIRCUIT BOARD

BACKGROUND OF THE INVENTION

1. Field of the Invention

This invention relates to electronic connector apparatus and more particularly to integrated circuit component sockets. The devices of this invention are particularly useful for electrically connecting crystal oscillators of various speeds to computer circuit boards.

2. Background

In a typical computer system today, many circuits are controlled by surface mounted crystal clock oscillators such as those supplied commercially by SaRonix, Pletronics, Inc. and others. The Pletronics SM1100 series of surface mount clock oscillators is a more specific exemplary type. Most computer systems installed today use clock oscillators at speeds below 40 MegaHertz (MHz). At these speeds oscillators have relatively low failure rates so that heretofore there has been little need for frequent replacement of the oscillator modules.

New computer systems are being designed to run at faster and faster speeds, requiring clock oscillators which run at 60 MHz, 80 MHz, and higher. Such higher speeds require design modifications of many of the standard circuits in these computer systems in order to avoid problems such as pulse echo, non-synchronization of multiple clocks, or general synchronization and reaction to more frequent clock pulses, etc. These circuit redesigns typically are tested at the prototype stage at low clock rates (for example, 20 MHz), and the clock rates then increased in a step-wise manner to isolate any rate-related problems. This step-wise increase in the clock rate is accomplished by demounting the 20 MHz clock oscillator, and mounting in its place a higher rate oscillator, say 40 MHz for example, and then retesting the circuits, boards, etc. with the higher clock rate. This procedure of de-mounting the clock oscillator module and mounting a higher rate module might be repeated with a 60 MHz module for additional retesting, and so on up to the highest clock rate for the particular circuit design.

A similar procedure occurs with these higher rate circuits during maintenance operations. In many cases, an apparent logic or circuit anomaly may not be correctly diagnosed or isolated without lowering the clock rate of the circuit. This requires removal (de-mounting) of the installed clock oscillator (for example an 80 MHz unit) and remounting a slower unit (for example a 40 MHz) in order to operate the circuit at the lower rate.

The problem which occurs in both the case of prototype testing and routine maintenance, is that there is no easy way to mount and de-mount the clock oscillator modules. All available clock oscillator modules are designed with either "J" leads compatible with the Electronic Industries Association (EIA) standard surface mount land pattern, or with "Gull-Wing" leads compatible with the semiconductor industry standard, SO-L-20 surface mount land pattern. These designs result in a mounting and de-mounting operation that typically requires removal of the circuit board involved, desoldering and often destructive removal of the installed unit, board cleanup, inserting of the new unit and resoldering. This procedure typically results in one-half to one and one-half days of reconfiguration effort on complex prototype boards, and unnecessarily increases development time and cost. This complex procedure for de-mounting and remounting a different clock makes trouble isolation and repair a difficult and time consuming task for service technicians. Thus there is a need for an apparatus which simplifies the insertion and replacement of clock oscillator modules. This need is further due to the dramatic increases in clock frequencies used by newer computer components, and the increasing density and complexity of related circuits and circuit boards.

Test sockets for integrated circuit devices have long been designed to allow easy and rapid replacement for mass testing and observation. Most such devices are designed for specific circuit modules. In the past, connector or socket type devices have been used or proposed for modules such as memory modules which can be added incrementally to a circuit board, or special configuration identification modules for parameters which change from time to time such as an ethernet address module. Such socket type devices generally contain female type jack assemblies into which the pins of the removable modules are inserted. However, many devices which are mounted on printed circuit boards have formed leads instead of pins such as the "J" leads of clock oscillators mentioned above. Socket assemblies to accommodate formed leads are not available for such devices as clock oscillator modules. The present invention fills this need.

An additional problem which has been experienced by users of pin type socket devices for component testing has been difficulty in obtaining acceptable electrical contact between the pins of the device being tested and the socket contacts. This problem is magnified when surface mount components are considered for use with sockets. However, the construction of the present invention provides greater surface contact and hence better electrical contact between the formed leads of the device and the socket contacts than the device normally has with the printed circuit board.

The socket apparatus of the present invention fills this need, and overcomes the shortcomings of the prior art devices as they relate to use with such surface mounted components.

SUMMARY OF THE INVENTION

An object of the present invention is to provide a device mountable on a printed circuit board which will permit the easy insertion and removal of a standard surface mount component.

The present invention provides an adapter system for use in connecting a component to a printed circuit board where the component has a body portion and electrical contact leads, and where the adapter system consists of two contact clip devices: one contact clip device which has a conductive portion which may be electrically connected to the printed circuit board and which has a second portion extending away from the plane of the printed circuit board; and the second contact clip device also having a conductive portion which may be electrically connected to the printed circuit board and which has a second portion extending away from the plane of the printed circuit board; and where the second contact clip device is positioned generally opposite to the first contact clip device in such a manner that the component may be insertable between the extending portions of the contact clip devices, whereby the component body portion is held securely by these extending portions to retain abutting electrical contact between the electrical contact leads of the component and the conducting portions of the contact clip devices.

In a preferred embodiment of the invention the contact clip devices may be enclosed within a non-conducting enclosure device and each of the contact clip devices may consist of a pair of contact clips having a predetermined angled configuration.

The contact clips may be generally L shaped with a clip-on foot of conducting material for attaching to the base of the non-conducting enclosure such that one part of the clip-on foot extends through an aperture in the base of the enclosure so as to make electrical contact with the printed circuit board. A horizontal stub at the top of the clip can be inserted into an aperture in the vertical side of the enclosure to hold the contact clip in place, thereby providing structure for a curved middle portion of the clip which forms a spring retention contact or bias holding area which can firmly hold the inserted component in place. In a preferred embodiment, the bias holding area is located in a position on the contact clip that is approximately at a distance from the foot of the clip which is equal to the height of the electrical contact leads on the component in order to securely hold the component in place and yet provide for easy insertion and removal. The spring tension of the clips forces abutting electrical contact between the component electrical leads and the conducting portion of the clips at the foot of the component lead and at the top on the component lead where the clip is forced against the lead by the spring tension of the bias holding portion of the clip.

DESCRIPTION OF THE DRAWINGS

The objects, features and advantages of the system of the present invention will be apparent from the following description in which:

FIG. 3 illustrates another view of the socket apparatus with the component contained therein; and FIG. 4 illustrates the relationship of the contact clips to the non-conducting enclosure and to an exemplary surface mount component.

DESCRIPTION OF THE PREFERRED EMBODIMENT

The present invention is an apparatus and method for facilitating the installation and removal of standard surface components on a printed circuit board. In the following description, particular specifications are disclosed when describing the various embodiments of the invention. These specifications are intended to provide an illustration of a specific application of the invention but are not intended to limit the application of the invention to any specific type of computer system, subsystem, equipment, or circuit board type. It will be apparent to one skilled in the art that the present invention may be practiced in a wide range of systems of various specifications and configurations. The following description also contains references to circuits and components which are well known in the art, and these should be interpreted in the illustrative and not the limited sense.

The socket device of the present invention is used to facilitate the installation and removal of standard surface mount clock oscillator components, similar to surface mount clock oscillators supplied by SaRonix, Pletronics, Inc. and others. The Pletronics SM1100 series is a more specific exemplary type. Referring to FIGS. 1(a)-1(d) typical prior art clock oscillator modules are depicted. This type module has a body 10 containing the crystal oscillator and electrical contact leads 12 for mounting the module onto a printed circuit board, according to the recommended land pattern 100 used for these devices.

Figure 1A:
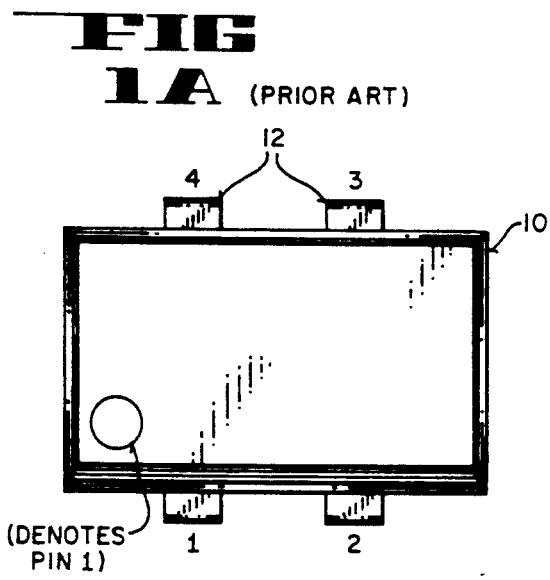
FIGS. 1(a)-1(d) depict a surface mount clock oscillator module of the type manufactured by Pletronics, Inc. as an exemplary surface mount component.
Figure 1B:
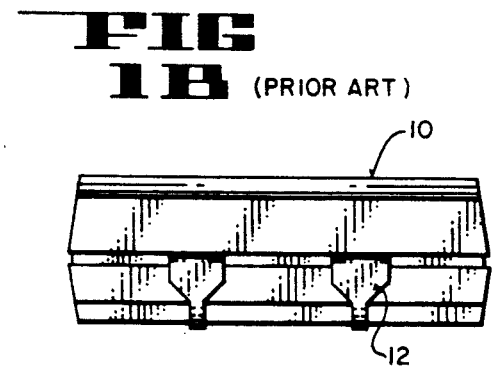
Figure 1C:
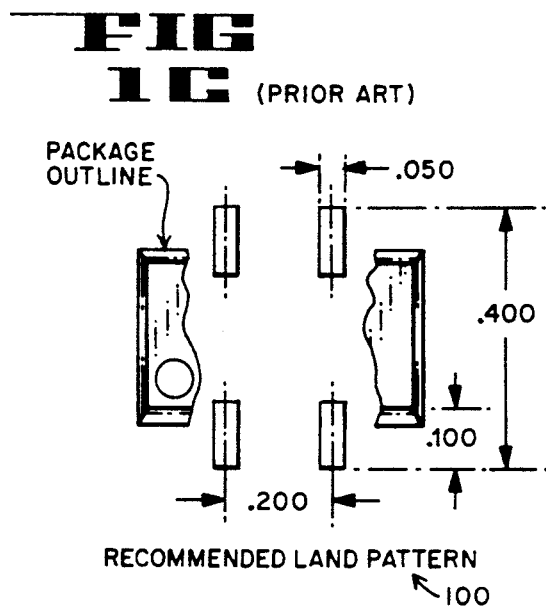
Figure 1D:
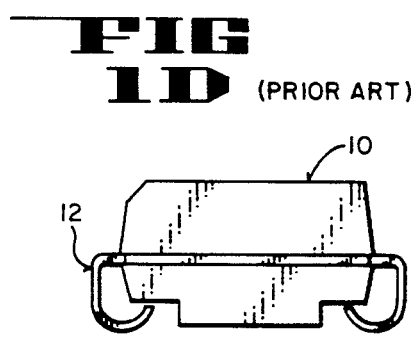
Figure 2A:
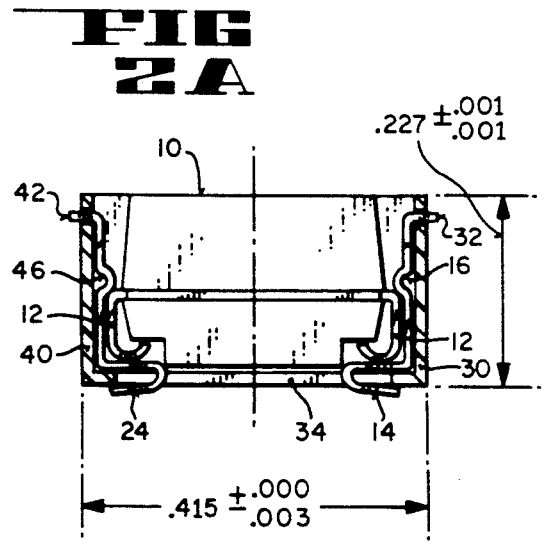
FIGS. 2(a)-2(b) depict a side view of the socket apparatus of the present invention showing a component inserted therein.
Figure 2B:
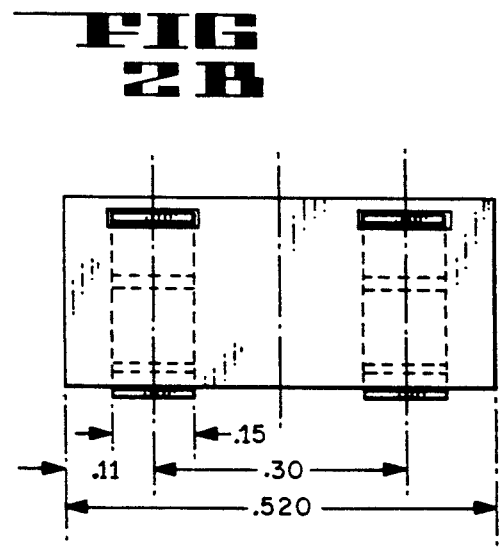

Referring now to FIGS. 2(a)-2(b) cross sections of the present invention are depicted. A non-conducting enclosure consisting of base 34 and sides 30 and 40 encloses contact clips 32 and 42. Contact clips 32 and 42 hold the body of the clock oscillator module 10 firmly in place retaining abutting electrical contact between the module's electrical contact leads 12 and the conducting portion of the contact clips 14 and 24 which extend through the base 34 of the enclosure to mate with a printed circuit board. The module body 10 is held securely in place by the inward curve of the contact clips 16 and 46 which forms a bias area to retain the module's electrical leads 12 in abutting contact with the feet of the contact clips 14 and 24. The upright portion of the clips also provide electrical contact surfaces, most especially at the point where the inward curve of the contact clips 16 and 46 press against the top of the electrical leads of the module. This feature provides more extensive contact with the component leads (in this example with the clock oscillator) than would be the case if the component was only connected by a solder joint through the foot of the leads.

Referring now the FIG. 3, a top perspective of the module socket is illustrated showing the non-conducting enclosure with sides 30 and 40 and base 34, and containing four contact clips 32, 42, 52 and 62, in which is positioned a sample clock oscillator module body 10. The enclosure contains the standard circle designation 70 to indicate the location of "Pin 1".

Referring now to FIG. 4 a detailed view of the preferred embodiment is shown. The L shaped contact clips 32, 42, 52 and 62 are shown. In a preferred embodiment each clip is constructed of spring copper approximately 0.009 inches thick with a tin plate finish approximately 0.001 inch thick. The essential characteristics of the L shaped contact clips 32, 42, 52 and 62 are that the clips be made of Beryllium Copper or Phosphor Bronze or similar material having conducting characteristics and therefore one skilled in these arts will recognize that variations in materials and dimensions in the fabrication of such contact clips do not limit the invention in any way. In the preferred embodiment the contact clips 32, 42, 52 and 62 are preconfigured into the L shape with a clip-on foot 14, 44, 54, 64, inward curving bias area 16, 46, 56, 66, and outwardly bent top portion 31, 41, 51, 61. Each contact clip 32, 42, 52, 62 is connected to the enclosure base 34 and sides 30 and 40 in a similar manner. For example, contact clip 32 is connected to the base 34 by inserting clip-on foot 14 into aperture 38 in base 34 and locking the clip onto the base 34 so that the outwardly bent top 31 is inserted into the aperture 36 in side 30 of the enclosure. Aperture 36 is slightly larger than the outwardly bent top portion 31 so that the clip 32 may move in the aperture 36 whenever a component is inserted into the socket device. The other clips are similarly connected through apertures in the base 34 and sides 30 and 40 of the enclosure. In the preferred embodiment the enclosure is made of moulded non-conducting polypropylene. It will be appreciated by one skilled in the art that other materials may be used for the enclosure without impact on the intent of the invention and that the dimensions of the socket device may conform to the size of the particular component to be installed or tested.

In normal use in the preferred embodiment the component socket is mounted on the printed circuit board by soldering the feet of the installed contact clips 14,44,54,64, which extend through the base of 34 of the non-conducting enclosure, to the board in accordance with the recommended land pattern 100 (in FIG. 1) for the surface mounted clock oscillator. Standard surface mount clock oscillators may then be easily inserted into the socket or easily removed therefrom as usage dictates.

Although the component socket apparatus has been described in connection with a clock oscillator module it should be apparent to those skilled in the art that the socket device architecture may be applied to other surface mount components.

What is claimed is:

1. An adaptor system for use in removably connecting a component to a printed circuit board, said component having electrical contact leads and a body portion, said adapter system comprising:
  a) a first contact clip device comprising at least two contact clips, with each contact clip having a conductive portion which may be electrically connected to said printed circuit board at a first electrical contact point on said board and a second portion extending away from said board; and
  b) a second contact clip device comprising at least two contact clips, with each contact clip having a conductive portion which may be electrically connected to said printed circuit board at a second electrical contact point on said board and a second portion extending away from said board; said second contact clip device being positionable generally opposite to said first contact clip device, and said component being insertable between said extending portions of said first and second contact clip devices, wherein each said contact clip comprises an L shaped member having a predetermined orientation in said adaptor system wherein a portion of the bottom conducting portion of the L is bent downward and folded back upon itself to form a clip-on foot of said contact clip, and wherein the top part of said extended portion is bent to a position perpendicular to said extended portion of said contact clip, and in a direction opposite to said bottom conducting portion of said clip, and wherein said upright portion of said contact clip is curved inwardly in the direction of said foot of said contact clip to form a bias holding area on said contact clip at approximately a distance above said foot of said contact clip to match the height of said electrical contact leads on said component,
  whereby said component body portion is held securely by said first and second extending portions to retain abutting electrical contact between both a top portion and a bottom portion of said component leads and said conducting portions of said first and second contact clip devices.

2. The adapter system of claim 1 further comprising a non-conductive enclosure device for enclosing said first and second contact clip devices.

3. The adapter system of claim 2 wherein said non-conducting enclosure device comprises two opposite and parallel vertical side members connected perpendicular to a bottom member; each of said side members containing apertures into which said top portion of said extended portion of each of said contact clips may be demountably attached and said bottom member containing apertures into which said clip-on foot of each of said contact clips may be demountably attached and through which said contact clips may be electrically mated to said printed circuit board.

4. The adapter system of claim 3 wherein said contact clips are spatially positioned in said enclosure device such that said clip-on feet of said contact clips are mated to said printed circuit board in the land pattern recommended for said surface mount component.

5. The adapter system of claim 4 wherein said contact clips are constructed of spring copper and coated with a tin finish, said contact clips being fully hardened subsequent to formation in said predetermined angled configuration.

6. A method for removably connecting a component to a printed circuit board, said component having electrical contact pins and a body portion, said method comprising the steps of:
  a) creating a first pair of contact clips having a conductive portion which may be electrically connected to said printed circuit board at a first pair of electrical contact points on said board and said first pair of contact clips having a second portion extending away from and essentially perpendicular to said board;
  b) creating a second pair of contact clips having a conductive portion which may be electrically connected to said printed circuit board at a second pair of electrical contact points on said board and a second portion extending away from said board, said second pair of contact clips being positionable generally opposite to said first pair of contact clips;
  c) forming each of said contact clips into an L shaped member having a bottom conductive portion and an extended portion which has a top part and a middle part, said L shaped member having a predetermined orientation in said adapter system wherein a portion of the bottom conductive portion of the L is bent downward and folded back upon itself to form a clip-on foot of said contact clip, and wherein said top part of the extended portion is bent to a position essentially perpendicular to said middle part of the extended portion of said contact clip, and in a direction opposite to said bottom conductive portion of said contact clip, and wherein said middle part of the extended portion of said contact clip is curved inwardly in the direction of said foot of said contact clip to form a bias holding area on said contact clip at approximately a distance above said foot of said contact clip to match the height of said electrical contact leads on said component;
  d) electrically attaching said conductive portions of said contact clips to said printed circuit board; and
  e) inserting said component between said extending portions of said first and second pair of contact clips whereby said component body portion is held securely by said extended portions of said contact clips to retain abutting electrical contact between said component leads and said conductive portions of said first and second pairs of contact clips.

7. The method of claim 6 comprising the additional step of mounting said L shaped clips into a non-conducting enclosure device which comprises two opposite and parallel vertical side members connected essentially perpendicular to a bottom member; each of said side members containing apertures into which said top part of said extended portion of each of said contact clips may be demountably attached and said bottom member containing apertures into which said clip-on foot of each of said contact clips may be demountably attached and through which said contact clips may be electrically mated to said printed circuit board.

8. The method of claim 7 comprising the additional step of spatially positioning said contact clips in said enclosure device such that said clip-on feet of said contact clips are mated to said printed circuit board in the land pattern recommended for said surface mount component.

9. The method of claim 8 wherein said component is a crystal oscillator.

* * * * *

UNITED STATES PATENT AND TRADEMARK OFFICE
CERTIFICATE OF CORRECTION

| | | |
|---|---|---|
| PATENT NO. | : | 5,288,236 |
| DATED | : | February 22, 1994 |
| INVENTOR(S) | : | McIntyre |

It is certified that error appears in the above-identified patent and that said Letters Patent is hereby corrected as shown below:

In column 5, claim 1 at line 49, please delete " adaptor " and insert -- adapter --.

In column 5, claim 1 at line 56, please delete " clip " and insert -- contact clip --.

Signed and Sealed this

Twenty-third Day of December, 1997

Attest:

BRUCE LEHMAN

*Attesting Officer*  *Commissioner of Patents and Trademarks*